United States Patent [19]
Mahnkopf et al.

[11] Patent Number: 5,587,599
[45] Date of Patent: Dec. 24, 1996

[54] BIPOLAR TRANSISTOR AND MANUFACTURING METHOD

[75] Inventors: Reinhard Mahnkopf; Andreas Vom Felde, both of Munich, Germany

[73] Assignee: Siemens Aktiengesellschaft, Munich, Germany

[21] Appl. No.: 449,213

[22] Filed: May 23, 1995

[30] Foreign Application Priority Data

May 25, 1994 [DE] Germany ................... 44 18 206.6

[51] Int. Cl.$^6$ ..................... H01L 29/76; H01L 21/265
[52] U.S. Cl. ................. 257/370; 257/350; 257/565; 437/31
[58] Field of Search ........................ 257/370, 347, 257/350, 565, 586, 378; 437/21, 31

[56] References Cited

U.S. PATENT DOCUMENTS

| | | | |
|---|---|---|---|
| 3,943,555 | 3/1976 | Mueller et al. | 257/350 |
| 4,868,624 | 9/1989 | Grung et al. | 357/34 |
| 5,087,580 | 2/1992 | Eklund | 437/31 |
| 5,289,027 | 2/1994 | Terrill et al. | 257/350 |
| 5,430,317 | 7/1995 | Onai et al. | 257/347 |

FOREIGN PATENT DOCUMENTS

| | | |
|---|---|---|
| 0476380 | 3/1992 | European Pat. Off. . |
| 0623951 | 9/1994 | European Pat. Off. . |
| 1028958 | 1/1989 | Japan . |

OTHER PUBLICATIONS

Proceedings of 1994 IEEE International Electron Devices Meeting, San Francisco, CA, Dec. 11–14, 1994, "Modelling and Simulation of High Speed, High Voltage Bipolar SOI Transistor With Fully Depleted Collector", T. Arnborg, pp. 743–746.

Proceedings of ISPSD 1994 International Symposium on Power Semiconductor Devices and IC's, Davos, Switzerland, 31 May–2 Jun. 1994, "Compact Very High Voltage CMOS Compatible Bipolar", A. Litwin et al, pp. 113–115.

IEDM publication 1992, S. Parke et al., "A Versatile, SOI BiCMOS Technology with Complementary Lateral BJT's", pp. 453–456.

Electron Devices Society of IEEE, Dec. 5–8, 1993, R. Dekker et al., "An Ultra Low Power Lateral Bipolar Polysilicon Emitter Technology on SOI", pp. 75–78.

IEEE Electron Device Letters, vol. EDL 6, No. 8, Aug. 1985, J. C. Sturm et al., "Vertical Bipolar Transistors in Laser–Recrystallized Polysilicon", pp. 400–402.

IEEE Electron Device Letters, vol. EDL 5, No. 11, Nov. 1984, B. Y. Tsaur et al., "Merged CMOS/Bipolar Technologies Utilizing Zone–Melting–Recrystallized SOI Films", pp. 461–463.

Japanese Journal of Applied Physics, vol. 30, No. 12B, Dec. 1991, T. Sugii et al., "A New SOI–Lateral Bipolar Transistor for High–Speed Operation", pp. L2080–L2082.

IEEE Transactions on Electron Devices, vol. 40, No. 12, Dec. 1993, "A Self–Aligned Lateral Bipolar Transistor Realized on SIMOX–Material", pp. 2359–2360.

*Primary Examiner*—Mark V. Prenty
*Attorney, Agent, or Firm*—Hill, Steadman & Simpson

[57] ABSTRACT

Bipolar transistor, potentially with monolithically integrated MOSFETs, in the body silicon layer having a thickness of approximately 0.6 μm in a SOI substrate, have a collector region and a base region that are produced by implantation. An oxide layer provided for the gate oxide of the MOSFETs is applied surface-wide and is partially removed in the region of the bipolar transistor, a polysilicon layer (5) also employed for the gate electrodes of the MOSFETs is applied and structured. Implantation for highly doped termination regions (5, 10, 12) for emitter, base and collector ensue with masks (13). An emitter region (8) is driven out of the highly doped polysilicon layer as terminal region for the emitter in a temperature step. The doping degree of the collector region, as lowest doped region, can be selected so light that the collector region is completely depleted. The function corresponds to a vertical bipolar transistor with a lateral collector space-charged zone.

17 Claims, 3 Drawing Sheets

BIPOLAR TRANSISTOR AND MANUFACTURING METHOD

BACKGROUND OF THE INVENTION

The present invention is directed to a bipolar transistor on a SOI substrate and to an appertaining manufacturing method.

A CBiCMOS process serves the purpose of simultaneously manufacturing the following, active components: npn bipolar transistors, pnp bipolar transistors, n-MOS transistors and p-MOS transistors. The realization of a complementary BiCMOS process (CBiCMOS) is of great technical and economic interest when the two following demands are met. First, the CBiCMOS process can be significantly more complex, i.e. more complicated than the pure CMOS process. Second, the components must have extremely good function properties (performance).

The bipolar transistors are vertically constructed in a realization of the four different transistor types on a normal substrate of bulk silicon or, respectively, on thick SOI substrates (useful silicon layer, what is referred to as the body silicon, thicker than 1 µm). The process outlay, however, is extremely high given the desired degree of performance. A CBiCMOS process can be realized far more simply on thin SOI substrates having a body silicon layer with a thickness of less than 0.2 µm. In all known methods, the bipolar transistors, like the MOSFETs, are laterally constructed. The structural format of the two transistor types is extremely similar and the complexity of the manufacturing method is relatively low. Such a process concept is described, for example, in the publication by S. Parke, et al., "A Versatile, SOI BiCMOS Technology with Complementary Lateral BJT's", in IEDM 92, 453–456 (1992). There are also concepts for a complementary bipolar process on a thin body silicon, such as disclosed in, for example, R. Dekker et al. in IEDM 93, 75–78 (1993), that can be expanded to a complete CBiCMOS process. In contrast to the vertical structure, a lateral structure of the bipolar transistors has a few fundamental disadvantages that drastically deteriorate the function properties. The electrical connection of the relatively narrow base region between emitter and collector can only ensue via the long transistor sides, resulting in a high base resistance. For an acceptable base resistance, the transistors must be implemented with short emitter lengths and must be connected in parallel. This increases the area requirement. The current yield of these embodiments is extremely low because of the small effective emitter areas of the latter transistors. For an acceptable current, there is again the necessity of connecting a plurality of transistors in parallel, which also substantially increases the area requirements. When a polysilicon emitter is eliminated because of the compatibility with the CMOS process in order to keep the outlay low, setting the gain of the transistors is made more difficult because of the elimination of the polyemitter effect.

SUMMARY OF THE INVENTION

It is an object of the present invention to provide a CMOS-compatible bipolar transistor on a SOI substrate that, given the simplest process management, avoids all of the initially cited disadvantages and thereby assures the best functionability (high performance).

In general terms the present invention is a bipolar transistor in a body silicon layer on an insulation layer of a SOI substrate, whereby this body silicon layer has a thickness of at most 1 µm. This bipolar transistor, with respect to this body silicon layer, has a collector region doped for a first conductivity type, a base region doped for a second conductivity type opposite the first conductivity type, and an emitter region doped for the first conductivity type vertically above one another. Contacts for collector, base and emitter are present. These contacts are respectively electrically conductively connected to the collector region, to the base region or, respectively, to the emitter region. The collector region is limited by the insulation layer at that side facing away from the base region. The collector region has such a light doping that the collector region is essentially completely depleted of charge carriers when potentials required for an intended employment of the bipolar transistor are applied.

Advantageous developments of the present invention are as follows.

The doping height of the collector region is so low that the collector region is essentially completely depleted without an applied external potential.

Terminal regions are present that electrically connect the contacts to the collector region to the base region or, respectively, to the emitter region. The terminal regions for the base and collector each respectively have a highly doped region provided with a contact and a transition region lightly doped in comparison thereto between this highly doped region and the base region or, respectively, the collector region.

In one embodiment of the present invention the bipolar transistor has at least one MOSFET integrated in the body silicon layer. In another embodiment the bipolar transistor has at least two MOSFETs complementary relative to one another integrated in the body silicon layer. In a further embodiment the bipolar transistor has at least one further bipolar transistor that is complementary and integrated in the body silicon layer.

The thickness of the body silicon layer amounts to at most 0.4 µm, or alternatively the thickness of the body silicon layer amounts to at most 0.2 µm.

The present invention is also a method for manufacturing such a bipolar transistor. In a first step, a region provided for the bipolar transistor is electrically insulated all around in the body silicon layer of a SOI substrate. In a second step upon employment of a mask technique, implantation of dopant ensue for forming the collector region and the base region. In a third step, a dielectric layer is applied and structured such that a portion of the region doped for the base region is uncovered. In a fourth step, a polysilicon layer provided for a terminal region of the emitter is applied and structured. In a fifth step, implantation masks are successively applied and removed and, upon employment of these implantation masks, implantation of dopant ensue for the fashioning of terminal regions. The doping degree for the terminal region of the emitter to be fashioned in this polysilicon layer is set such that a following tempering step can be undertaken such that dopant atoms driven out of the polysilicon layer into the region doped for the base region form a planned emitter region. In a sixth step, contacts are applied onto the terminal regions.

Advantageous developments of the present invention are as follows.

A podium implantation for modifying the degree of the doping of the collector region in that region wherein the dielectric layer was removed in the third step is undertaken between the third and the fourth step.

In the first step, every region provided for a MOSFET is electrically insulated all around and a respective channel region for the gate is produced. In the third step, the dielectric layer is applied as an oxide layer having a thickness provided for the gate oxide of the MOSFETs. In the fourth step, the polysilicon layer is structured such that it has the dimension of a planned gate electrode in every region provided for a MOSFET. In the fifth step, source and drain regions and the doping of the gate electrode are produced in every region provided for a MOSFET. In the sixth step, contacts for the electrical connection of source, drain and gate of each MOSFET are produced.

Spacers are applied at edges of the polysilicon layer between the fourth step and the fifth step. In the fifth step, the uncovered spacers are removed after an ensuing implantation and a further implantation for the same conductivity type is undertaken for producing lightly doped transition regions.

BRIEF DESCRIPTION OF THE DRAWINGS

The features of the present invention, which are believed to be novel, are set forth with particularity in the appended claims. The invention, together with further objects and advantages may best be understood by reference to the following description taken in conjunction with the accompanying drawings, in the several Figures of which like reference numerals identify like elements, and in which:

DESCRIPTION OF THE PREFERRED EMBODIMENTS

In the inventive component, a collector region and a base region are formed above one another by implantation in a thin body silicon layer of a SOI substrate. An emitter region is produced in the base region, preferably by drive-out of dopant from a doped polysilicon layer applied thereon. Lateral, doped regions having the respective conductivity type of the appertaining layer to be connected are used for the electrical connection. The contacting ensues from the upper side. A more detailed description of the structure of this component follows with reference to a manufacturing method.

Figure 1:
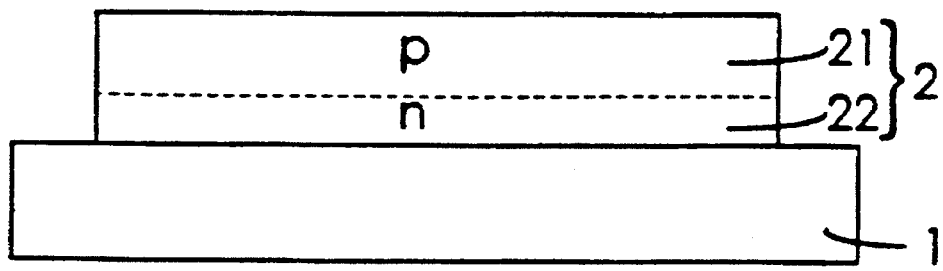
FIGS. 1–4 show intermediate steps in the formation of the inventive component in cross section after various steps in the manufacturing method.

Beginning with an SOI substrate, an insulation layer 1 (see FIG. 1) of, for example, an oxide is applied on a base body of, for example, silicon and a thin, crystalline silicon layer 2 is applied on the insulation layer 1. The thin silicon layer 2, for example, is approximately 0.2 µm thick and shall be referred to below as a body silicon layer. This layer thickness is suitable for the manufacture of CMOS transistors on a common SOI substrate. For this purpose, the regions provided for the individual transistors are isolated from one another and a basic doping is potentially produced for the formation of the channel regions of the MOSFETs. The insulation of the regions provided for the individual transistor can ensue, for example, by LOCOS, i.e. a locally limited oxidation of the silicon layer, or by etching mesas. Given the embodiment described here, the illustration is limited to a bipolar transistor manufactured in a mesa. Regardless of the manufacture of MOSFETs in the same substrate, the thickness of the body silicon layer 2 in expedient embodiments of the inventive bipolar transistor amounts to at the most 0.6 µm. Dependent on the specific demands, the thickness of the body silicon layer amounts, for example, to at most only 0.4 µm or only at most 0.2 µm. The bipolar transistor, however, can also be realized in a silicon layer that is 1 µm thick.

Upon employment of a mask technique, as is standard in the manufacture of semiconductor components, particularly in the CMOS process in silicon, implantation for the formation of a collector region 22 are undertaken in the region provided for the bipolar transistor and implantation of a brace region 21 are undertaken thereover. The implanted dopant is thereby respectively selected in conformity with the intended operational sign of the conductivity type. The manufacture of an npn transistor is depicted as an example. An important advantage of the method disclosed herein is that it can be employed as a CBiCMOS process and, thus, complementary pnp transistors can, in particular, be manufactured on the same SOI substrate. A further mask is to be correspondingly provided for the implantation of collector and base region of these complementary transistors. The lowest implanted region is consistently referred to below as the collector region. fundamentally, however, the lowest dope region of the transistor can also be provided as emitter region or can be operated as emitter region in a circuit.

Figure 2:
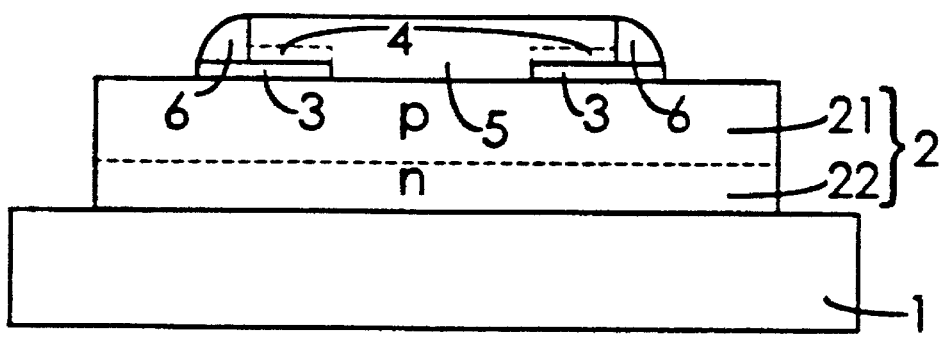

Next, an oxide layer 3 is applied surface-wide as depicted in FIG. 2. This oxide layer 3 serves as gate oxide given simultaneous manufacture of MOSFETs and is then applied in a thickness suitable for this purpose. Potentially, a thin polysilicon layer 4 (what is referred to as split poly) is applied onto this oxide layer 3. The oxide layer 3 in the region of the emitter to be manufactured is completely removed in a part of the surface of the base region 21, so that the surface of this base region 21 is uncovered and the remaining oxide layer 3 annularly surrounds this uncovered region, as shown for example in FIG. 2. The mask technique employed for the partial removal of the oxide layer 3 is preferably not applied directly on the oxide layer 3, but is applied on the thin polysilicon layer 4. This is done because, given employment as CBiCMOS process, the mask technique directly on the gate oxide could deteriorate the properties of the MOSFETs. Fundamentally, the oxide layer 3 can also be entirely omitted given the inventive bipolar transistor.

After this method step, the doping of the collector region 22 can be optionally increased or decreased with what is referred to as a podium implantation. This implantation ensues in the region of the opening of the oxide layer 3. When npn and pnp transistors are simultaneously produced, additional mask techniques are necessary for these respective podium implantation. Subsequently, a polysilicon layer 5 is deposited, this also potentially forming the polysilicon of the gate electrode in the MOSFETs. This polysilicon layer 5 belongs to a preferred exemplary embodiment of the bipolar transistor and forms the emitter terminal layer here. This polysilicon layer covers that part of the base region 21 previously freed of the oxide layer 3. After the structuring of this polysilicon layer 5, the spacers 6 depicted in FIG. 2 can be produced at the edges of the polysilicon layer 5. These spacers, for example, can be of oxide and can be produced with anisotropic reetching of an oxide layer previously applied surface-wide. Alternatively, vertical portions of a layer applied surface-wide can function as spacers at the edges of the polysilicon layer 5. The term "spacer" is generally used to also refer to such vertical portions of a surface-wide layer.

Figure 3:
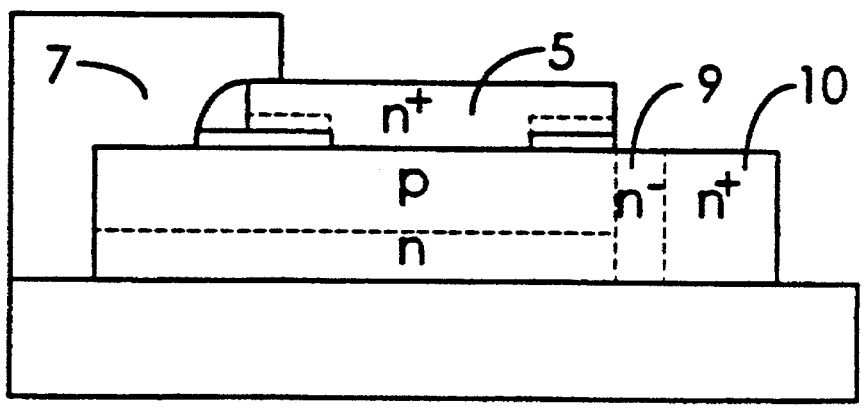
Figure 4:
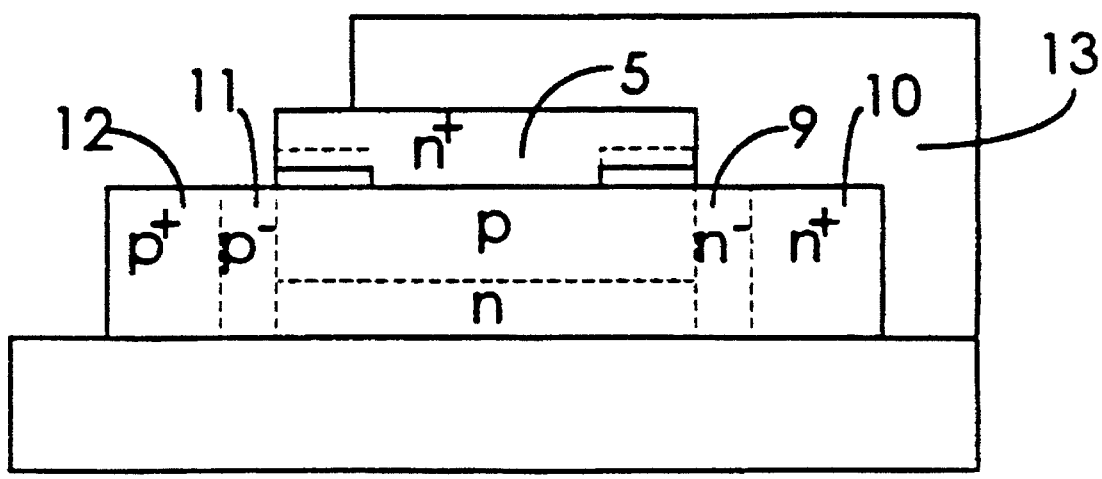
Figure 5:
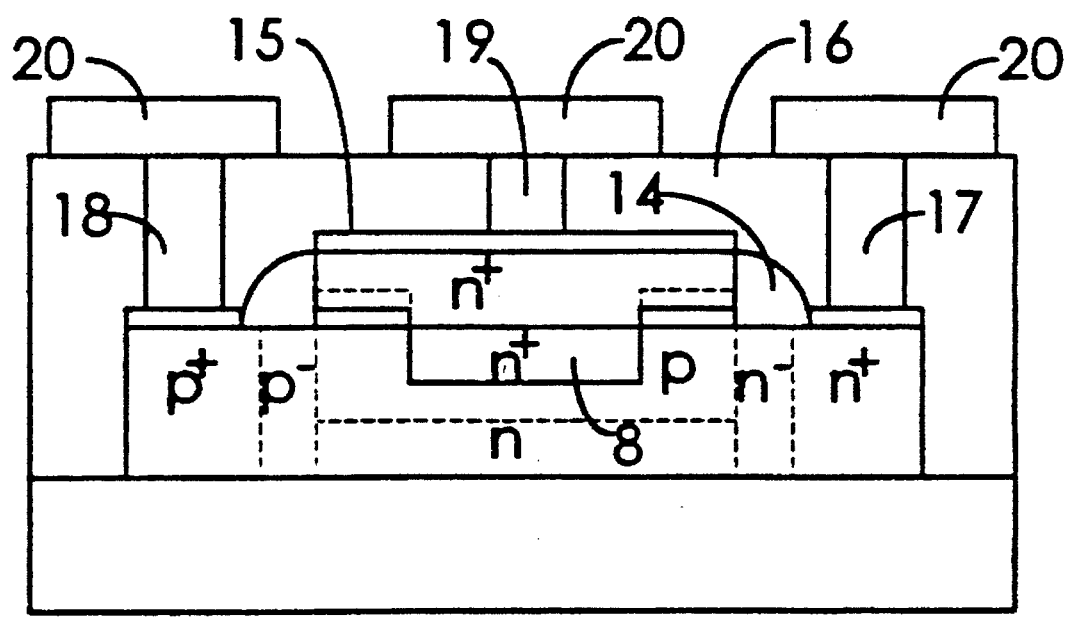
FIG. 5 shows an embodiment of the inventive component in cross section.

In succession following thereupon, a lacquer mask is applied and removed and a further lacquer mask is applied and removed. These masks serve for the implantation of dopant for one of the conductivity types. The first implantation mask 7 shown in FIG. 3 leaves the regions provided for the end-conduction free in this example. In this npn transistor, these are the regions of the polysilicon layer 5 provided for the emitter and the lateral region provided for the formation of terminal regions for the collector region 22. When pnp transistors are also manufactured, this implantation mask 7 in the pnp transistors covers the complimentary regions and leaves free the regions provided for the formation of the terminal regions of the base. For the implantation for the opposite conductivity, the implantation mask 13 shown in FIG. 4 that respectively leaves the complimentary regions free is then applied. The sequence of n-doping and p-doping is basically discretionary. Given the exemplary embodiment of FIG. 3, the implantation is undertaken first for n-conduction. The polysilicon layer 5 that also forms the terminal region for the emitter is thereby doped $n^+$-conductive. In a following tempering step, the drive-out of dopant from the polysilicon layer 5 into the base region is then effected, so that an emitter region 8 as depicted in FIG. 5 is formed. Bounded by the spacers, the highly n-conductively doped terminal region 10 for the collector region results. The spacer in the region not covered by the mask 7 can then be etched off, for example wet-chemically, together with that part of the outside layer 3 situated therebelow and a renewed implantation for the same conductivity type can be undertaken, so that the lightly doped transition region 9 is formed between the collector region and the terminal region 10 provided therefor. In regions provided for MOSFETs, the appertaining transition regions between gate and drain with which a LDD (lightly doped drain) is fashioned can thus be simultaneously manufactured. However, it is also fundamentally possible to forgo the spacers 6 and the manufacture of the transition regions.

After the removal of the mask 7, the complementary mask 13 is applied, this serving the purpose of an implantation of dopant for the opposite operational sign of the conductivity. In this example, the highly p-conductively doped terminal region 12 for the base region is thus obtained (see FIG. 4). After the removal of what is now the uncovered part of the spacers and the part of the oxide layer 3 situated therebelow, a further implantation can be undertaken that forms a correspondingly more lightly doped transition region 11 between this terminal region 12 and the base region. LDDs for complementary MOSFETs can be simultaneously manufactured. The structure of these MOSFETs provided with LDDs is fundamentally known and shall therefore not be described with reference to FIGS. 1–6. The boundary surface between the polysilicon layer 5 and the base layer 21, i.e. between the emitter region and the appertaining terminal region of the finished component, has a size of approximately 0.8 μm×0.8 μm in this example.

The electrical terminals then must still be applied for finishing the component. Further spacers 14, as shown in FIG. 5, can thereby be produced at the edges of the polysilicon layer 5. These further spacers 14 can, for example, be an oxide (for example, $SiO_2$) that is first applied surfacewise and then anisotropically reetched. Upon employment of these further spacers 14 as spacers, a silicide layer 15 is then applied on the upper sides of the terminal regions (for example, by means of what is referred to as the silicide process wherein, for example, titanium is sputtered on, this reacting with the silicon to form low-impedance $TiSi_2$). After the entire upper side has been planarized, for example with a dielectric 16, via holes are etched therein for the electrical connection and are filled with metal, so that the contacts 17, 18, 19 for the electrical connection of collector, base and emitter are thus manufactured. The first metalization level can then be applied onto the upper side, this being shown in FIG. 5 with the terminal surfaces 20 or interconnects.

Figure 6:
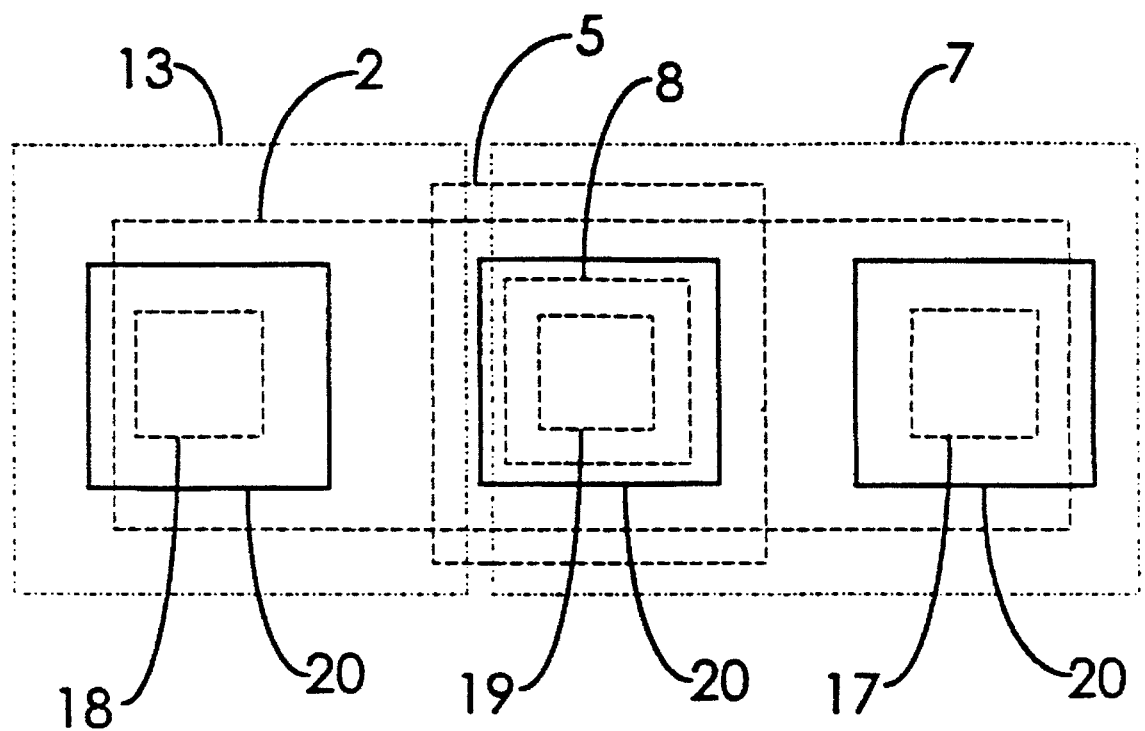
FIG. 6 shows a plan view onto the component with indication of the boundaries that define the structure.

The demarcations that are the determining factor for the structure of the component are shown in FIG. 6 in a plan view of the bipolar transistor. Broken lines thereby indicate covered contours. Dot-dash lines, wherein respectively one dot follows a dash, indicate the outer demarcations of the opening of employed masks. The demarcations of the terminal surfaces 20 of the first metalization level is depicted in FIG. 6. The contacts 17, 18, 19 are depicted as covered contours, these being shown here with a quadratic cross section in simplified fashion. The lateral demarcations of the driven-out emitter region 8, of the polysilicon layer 5 and of the mesas formed by the body silicon layer 2 are likewise entered as covered contours. The masks 7, 13 employed for the implantation of the terminal regions are respectively entered dot-dashed. The regions respectively covered by these successively applied masks can also adjoin or overlap one another. The emitter contact 19 can cover the entire surface of the emitter region 8 and can even project somewhat onto the laterally adjoining oxide of the oxide layer 3. This oxide layer 3 is present between the contour of the emitter region 8 and the contour of the polysilicon layer 5 on the underside of the polysilicon layer 5. Instead of the separate terminal areas 20 that are shown for simplifying the illustration, portions of interconnects can also be applied onto the contacts 17, 18, 19.

In advantageous embodiments, the collector region 22 between the base region 21 and the insulating layer 1 is provided with such a light doping that the collector region 22 is essentially completely depleted of charge carriers when the electrical potentials required for the intended operating mode of the transistor are applied. A complete depletion of the collector region 22 is already achieved in the condition without an applied, external potential when the product of the square of the thickness of the collector region 22 and the doping density amounts to at most $8 \cdot 10^6 cm^{-1}$. In such embodiments, the low thickness of the body silicon layer 2 can play a part in the framework of a CMOS process independently of the embodiment.

The described manufacturing method for the bipolar transistors is fully compatible with the manufacture of the CMOSFETs. Compared to a pure CMOS process, the added outlay in this complementary CBiCMOS process amounts to three phototechniques, namely the masks for the collector and base implantation for the respective npn transistors and pnp transistors, separately, and the mask for the opening of the region in the gate oxide layer provided for the emitter. One fewer photo mask step is required compared to the CBiCMOS processes with lateral bipolar transistors known from the references. By contrast to the CMOS-compatible, lateral bipolar transistor, the inventive vertical-lateral bipolar transistor has mainly the following, basic advantages.

The electrical connection to the base is brought laterally to the layer structure at the broad sides of the transistor, so that the base resistance is extremely low. The comparatively large emitter area assures a high current yield. Given the especially preferred embodiment that has been presented here wherein a separate layer of polysilicon is present for the emitter, the gain can be designationally set nearly independently of the dopant profiles by drive-out from this polysilicon into the emitter region upon exploitation of the polyemitter effect.

Over and above this, the inventive bipolar transistor offers excellent operating properties, particularly a short base width for high limit frequency as well as a high early voltage. The base width of this bipolar transistor can be set exactly with ion implantation because of the vertical layer structure, as in the case of known high-performance bipolar devices. The appertaining technology can be employed without limitation in the inventive component.

A high early voltage of the bipolar transistors is desirable for analog applications. This can only be achieved with moderately doped, relatively wide collector regions wherein the space-charge zone can expand over a great distance given an applied blocking voltage. This is assured in the inventive transistor design by the long, laterally arranged collector path that, dependent on the demands, can be designationally set by the respective design of the transistor. The component can be optimized in view of high early voltages or high current yield via the doping of the entire collector region 22 and, potentially, an additional podium implantation of the collector under the emitter region. The inventive component therefore enables especially good performance given a simultaneously significantly simplified manufacturability.

The present invention is not limited to the particular details of the method and apparatus depicted and other modifications and applications are contemplated. Certain other changes may be made to the above described method and apparatus without departing from the true spirit and scope of the invention herein involved. It is intended, therefore, that the subject matter in the above depiction shall be interpreted as illustrative and not in a limiting sense.

What is claimed is:

1. A bipolar transistor in a body silicon layer on an insulation layer of a SOI substrate, comprising:

said body silicon layer having a thickness of at most 1 µm;

with respect to said body silicon layer, a collector region doped for a first conductivity type, a base region doped for a second conductivity type opposite said first conductivity type, and an emitter region doped for said first conductivity type arranged vertically above one another;

contacts for collector, base and emitter;

said contacts respectively electrically connected to said collector region, to said base region and to this emitter region;

said collector region being limited by said insulation layer at a side facing away from said base region; and said collector region having a thickness and doping density wherein the product of the square of said thickness and said doping density is less than $8 \times 10^6$ cm$^{-1}$ and such that the collector region is substantially depleted of charge carriers when potentials required for a predetermined employment of the bipolar transistor are applied.

2. The bipolar transistor according to claim 1, wherein the bipolar transistor further comprises terminal regions that respectively electrically connect the contacts to the collector region, to the base region and to the emitter region; and wherein the terminal regions for the base and collector each respectively comprise a highly doped region provided with a respective contact of said contacts and a transition region lightly doped in comparison thereto between said highly doped region and the base region or, respectively, the collector region.

3. The bipolar transistor according to claim 1, wherein the bipolar transistor comprises at least one MOSFET integrated in the body silicon layer.

4. The bipolar transistor according to claim 1, wherein the bipolar transistor comprises at least two MOSFETs complementary relative to one another integrated in the body silicon layer.

5. The bipolar transistor according to claim 1, wherein the bipolar transistor comprises at least one further bipolar transistor that is complementary and integrated in the body silicon layer.

6. The bipolar transistor according to claim 1, wherein the thickness of the body silicon layer amounts to at most 0.4 µm.

7. The bipolar transistor according to claim 1, wherein the thickness of the body silicon layer amounts to at most 0.2 µm.

8. A method for manufacturing a bipolar transistor, comprising the steps of:

in a first step, electrically insulating a region for the bipolar transistor all around in a body silicon layer of a SOI substrate;

in a second step upon employment of a mask technique, implanting dopant for forming a collector region and a base region;

in a third step, applying a dielectric layer and structuring the dielectric layer such that a portion of a region doped for the base region is uncovered and undertaking a podium implantation for modifying the degree of doping of the collector region in the region wherein the dielectric layer was removed;

in a fourth step, applying and structuring a polysilicon layer for a terminal region of the emitter;

in a fifth step, successively applying and removing implantation masks and, upon employment of these implantation masks, implanting dopant for forming terminal regions, whereby the degree of doping for the terminal region of the emitter to be formed in this polysilicon layer is set such that a following tempering step can be undertaken such that dopant atoms driven out of the polysilicon layer into the region doped for the base region form a predetermined emitter region, the collector region having a thickness and doping density wherein the product of the square of said thickness and said doping density is less than $8 \times 10^6$ cm$^{-1}$; and in a sixth step, applying contacts the terminal regions.

9. A method for manufacturing a bipolar transistor and at least one MOSFET, comprising the steps of:

in a first step, electrically insulating a region for the bipolar transistor all around in a body silicon layer of a SOI substrate;

in a second step upon employment of a mask technique, implanting dopant for forming a collector region and a base region;

in a third step, applying a dielectric layer and structuring the dielectric layer such that a portion of a region doped for the base region is uncovered;

in a fourth step, applying and structuring a polysilicon layer for a terminal region of the emitter;

in a fifth step, successively applying and removing implantation masks and, upon employment of these implantation masks, implanting dopant for forming terminal regions, whereby the degree of doping for the terminal region of the emitter to be formed in this polysilicon layer is set such that a following tempering step can be undertaken such that dopant atoms driven out of the polysilicon layer into the region doped for the base region form a predetermined emitter region;

in a sixth step, apply contacts the terminal regions; and for integrating the at least one MOSFET in the body silicon layer, in the first step, electrically insulating every region provided for a MOSFET and providing a respective channel region for a gate; in the third step, applying the dielectric layer as an oxide layer having a thickness provided for the gate oxide of the MOSFET; in the fourth step, structuring the polysilicon layer such that the polysilicon layer has the dimension of a predetermined gate electrode in every region provided for a MOSFET; in the fifth step, producing source and drain regions and doping of the gate electrode in every region provided for a MOSFET; and in the sixth step, producing contacts for electrical connection of source, drain and gate of each MOSFET.

10. A method for manufacturing a bipolar transistor, comprising the steps of:

in a first step, electrically insulating a region for the bipolar transistor all around in a body silicon layer of a SOI substrate;

in a second step upon employment of a mask technique, implanting dopant for forming a collector region and a base region;

in a third step, applying a dielectric layer and structuring the dielectric layer such that a portion of a region doped for the base region is uncovered;

in a fourth step, applying and structuring a polysilicon layer for a terminal region of the emitter and applying spacers at edges of the polysilicon layer;

in a fifth step, successively applying and removing implantation masks and, upon employment of these implantation masks, implanting dopant for forming terminal regions, whereby the degree of doping for the terminal region of the emitter to be formed in this polysilicon layer is set such that a following tempering step can be undertaken such that dopant atoms driven out of the polysilicon layer into the region doped for the base region form a predetermined emitter region; and removing uncovered spacers after the implantation and undertaking a further implantation for the same conductivity type for producing lightly doped transition regions; and in a sixth step, applying contacts the terminal regions.

11. A bipolar transistor in a body silicon layer on an insulation layer of a SOI substrate, comprising:

said body silicon layer having a thickness of at most 1μm;

with respect to said body silicon layer, a collector region doped for a first conductivity type, a base region doped for a second conductivity type opposite said first conductivity type, and an emitter region doped for said first conductivity type arranged vertically above one another;

contacts for collector, base and emitter;

said contacts respectively electrically connected to said collector region, to said base region and to this emitter region;

said collector region being limited by said insulation layer at a side facing away from said base region; and said collector region having a thickness and doping density wherein the product of the square of said thickness and said doping density is less than $8 \times 10^6$ cm$^{-1}$.

12. The bipolar transistor according to claim 11, wherein the bipolar transistor further comprises terminal regions that respectively electrically connect the contacts to the collector region, to the base region and to the emitter region; and wherein the terminal regions for the base and collector each respectively comprise a highly doped region provided with a respective contact of said contacts and a transition region lightly doped in comparison thereto between said highly doped region and the base region or, respectively, the collector region.

13. The bipolar transistor according to claim 11, wherein the bipolar transistor comprises at least one MOSFET integrated in the body silicon layer.

14. The bipolar transistor according to claim 11, wherein the bipolar transistor comprises at least two MOSFETs complementary relative to one another integrated in the body silicon layer.

15. The bipolar transistor according to claim 11, wherein the bipolar transistor comprises at least one further bipolar transistor that is complementary and integrated in the body silicon layer.

16. The bipolar transistor according to claim 11, wherein the thickness of the body silicon layer amounts to at most 0.4 μm.

17. The bipolar transistor according to claim 11, wherein the thickness of the body silicon layer amounts to at most 0.2 μm.

* * * * *